United States Patent
Qin et al.

(10) Patent No.: US 10,600,917 B2
(45) Date of Patent: Mar. 24, 2020

(54) FIELD EFFECT TRANSISTOR AND MANUFACTURING METHOD THEREOF

(71) Applicant: Huawei Technologies Co., Ltd., Shenzhen, Guangdong (CN)

(72) Inventors: Xudong Qin, Shenzhen (CN); Huilong Xu, Shenzhen (CN); Chen-Xiong Zhang, Plano, TX (US)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/119,415

(22) Filed: Aug. 31, 2018

(65) Prior Publication Data

US 2019/0019897 A1     Jan. 17, 2019

Related U.S. Application Data

(63) Continuation of application No. PCT/CN2016/077991, filed on Mar. 31, 2016.

(51) Int. Cl.
*H01L 29/786* (2006.01)
*H01L 29/423* (2006.01)
(Continued)

(52) U.S. Cl.
CPC .... *H01L 29/78645* (2013.01); *H01L 29/1033* (2013.01); *H01L 29/1606* (2013.01);
(Continued)

(58) Field of Classification Search
CPC . H01L 29/1033; H01L 29/1606; H01L 29/24; H01L 29/41733; H01L 29/42356;
(Continued)

(56) References Cited

U.S. PATENT DOCUMENTS 8,952,356 B2    2/2015   Kim et al.
2002/0139978 A1   10/2002   Yamazaki et al.
(Continued)

FOREIGN PATENT DOCUMENTS

CN     103077968 A    5/2013
CN     103208524 A    7/2013
(Continued)

OTHER PUBLICATIONS

Yu-Ming Lin et al, "Dual Gate Graphene FETs with fT of 50 GHz", IEEE Electron Device Letters, vol. 31, No. 1, Jan. 2010, 3 pages.

*Primary Examiner* — Andrew Q Tran
(74) *Attorney, Agent, or Firm* — Conley Rose, P.C.

(57) ABSTRACT

A field effect transistor and a manufacturing method thereof are provided. The field effect transistor includes two top gate structures (1031C and 1031D) and two bottom gate structures (1032A and 1032B). The top gate structures (1031C and 1031D) and the bottom gate structures (1032A and 1032B) are opposite to each other in pair. This increases a quantity of control-voltage-induced carriers in the field effect transistor, and therefore increases an output current of the field effect transistor, improves a power gain limit frequency in high-frequency use, and makes an electric field between the top gate structures (1031C and 1031D) and the bottom gate structures (1032A and 1032B) more adequately cover a channel layer (106) between source structures (1041 and 1042) and a drain (105), thereby reducing a parasitic effect in a high frequency, and further improving a frequency characteristic of the field effect transistor.

15 Claims, 6 Drawing Sheets

(51) Int. Cl.
*H01L 29/24* (2006.01)
*H01L 29/66* (2006.01)
*H01L 29/778* (2006.01)
*H01L 29/16* (2006.01)
*H01L 29/10* (2006.01)
*H01L 29/417* (2006.01)
*H01L 29/78* (2006.01)

(52) U.S. Cl.
CPC ........ *H01L 29/24* (2013.01); *H01L 29/41733* (2013.01); *H01L 29/4236* (2013.01); *H01L 29/42356* (2013.01); *H01L 29/42368* (2013.01); *H01L 29/42384* (2013.01); *H01L 29/66037* (2013.01); *H01L 29/66742* (2013.01); *H01L 29/66969* (2013.01); *H01L 29/778* (2013.01); *H01L 29/78603* (2013.01); *H01L 29/78606* (2013.01); *H01L 29/78648* (2013.01); *H01L 29/78684* (2013.01); *H01L 29/78696* (2013.01); *H01L 29/7831* (2013.01)

(58) Field of Classification Search
CPC ........... H01L 29/4236; H01L 29/42368; H01L 29/42384; H01L 29/66037; H01L 29/66742; H01L 29/66969; H01L 29/778; H01L 29/78603; H01L 29/78606; H01L 29/78645; H01L 29/78648; H01L 29/78684; H01L 29/78696

See application file for complete search history.

(56) References Cited

U.S. PATENT DOCUMENTS

| | | |
|---|---|---|
| 2006/0209222 A1 | 9/2006 | Yasuda et al. |
| 2009/0159894 A1 | 6/2009 | Yasumatsu |
| 2011/0266543 A1 | 11/2011 | Moriwaki |
| 2012/0112250 A1 | 5/2012 | Chung et al. |
| 2012/0175594 A1 | 7/2012 | Chen et al. |
| 2012/0235118 A1 | 9/2012 | Avouris et al. |
| 2013/0161587 A1 | 6/2013 | Xianyu et al. |
| 2014/0014905 A1 | 1/2014 | Lee et al. |
| 2014/0054701 A1 | 2/2014 | Jiang |
| 2015/0171167 A1 | 6/2015 | Nourbakhsh et al. |
| 2019/0019897 A1* | 1/2019 | Qin .................. H01L 29/66037 |

FOREIGN PATENT DOCUMENTS

| | | | |
|---|---|---|---|
| CN | 103308584 A | 9/2013 | |
| JP | 2000196093 A | 7/2000 | |
| JP | 2001077342 A | 3/2001 | |
| WO | WO-2017166167 A1 * | 10/2017 | ....... H01L 29/42356 |

* cited by examiner

FIELD EFFECT TRANSISTOR AND MANUFACTURING METHOD THEREOF

CROSS-REFERENCE TO RELATED APPLICATIONS

This application is a continuation of International Application No. PCT/CN2016/077991, filed on Mar. 31, 2016, the disclosure of which is hereby incorporated by reference in its entirety.

TECHNICAL FIELD

The present application relates to the field of electronic technologies, and in particular, to a field effect transistor and a manufacturing method thereof.

BACKGROUND

With development of electronic technologies, a frequency characteristic of an electronic element in a silicon integrated circuit, for example, a power gain limit frequency, gradually approaches a physical law limit. Therefore, how to further improve the frequency characteristic of the electronic element becomes an important technical concern in the art.

A field effect transistor is a common electronic element. In the prior art, a field effect transistor is usually prepared by using a silicon-based semiconductor material. To provide a better frequency characteristic, a two-dimensional material, for example, graphene, may be used instead of the silicon-based semiconductor material, thereby preparing a graphene-material-based field effect transistor. The graphene material has advantages of a two-dimensional characteristic, a high electron mobility rate, and a high saturation velocity. Therefore, the graphene-material-based field effect transistor can have a better frequency characteristic, for example, a higher cut-off frequency, than the conventional silicon-based field effect transistor.

However, because the graphene-material-based field effect transistor still uses a conventional insulation gate field effect transistor structure, problems such as a low output current, a great carrier scattering effect, and an obvious parasitic effect, tend to result. Consequently, the graphene-material-based field effect transistor does not have an ideal frequency characteristic.

SUMMARY

To resolve the technical problem in the art, embodiments of the present application provide a field effect transistor and a manufacturing method thereof. The technical solutions are as follows:

According to a first aspect, a field effect transistor is provided, and the field effect transistor includes:
a substrate layer 101, where a first gate structure 1032A and a second gate structure 1032B are disposed in a groove in an upper surface of the substrate layer 101;
a bottom gate insulation layer 1022 covering the upper surface of the substrate layer 101;
a channel layer 106 covering an upper surface of the bottom gate insulation layer 1022; and
a top gate insulation layer 1021 covering an upper surface of the channel layer 106, where
a first source structure 1041, a second source structure 1042, and a drain 105 disposed between the first source structure 1041 and the second source structure 1042, are disposed on a lower surface of the top gate insulation layer 1021;
a third gate structure 1031C and a fourth gate structure 1031D are disposed in a groove in an upper surface of the top gate insulation layer 1021;
the third gate structure 1031C is disposed in a first projection region, of the first gate structure 1032A, on the top gate insulation layer 1021, and the first projection region is located between the first source structure 1041 and the drain 105; and
the fourth gate structure 1031D is disposed in a second projection region, of the second gate structure 1032B, on the top gate insulation layer 1021, and the second projection region is located between the second source structure 1042 and the drain 105.

In a possible design of the first aspect, two edges of the first projection region coincide with an edge of the first source structure 1041 and an edge of the drain 105, respectively, and two edges of the second projection region coincide with an edge of the second source structure 1042 and an edge of the drain 105, respectively.

In a possible design of the first aspect, an area of the third gate structure 1031C is less than or equal to an area of the first projection region; and
an area of the fourth gate structure 1031D is less than or equal to an area of the second projection region.

In a possible design of the first aspect, the third gate structure 1031C and the fourth gate structure 1031D are parallel to each other; or
the third gate structure 1031C and the fourth gate structure 1031D form a door-frame-like communicating structure.

In a possible design of the first aspect, the first gate structure 1032A and the third gate structure 1031C connect with each other through a contact hole, and the second gate structure 1032B and the fourth gate structure 1031D connect with each other through a contact hole.

In a possible design of the first aspect, the channel layer uses one of graphene, molybdenum, disulfide, black phosphorus, or another two-dimensional material.

According to a second aspect, a field effect transistor is provided, and the field effect transistor includes:
a substrate layer 401, where a first gate structure 4032A and a first bottom gate insulation layer 4022A covering the first gate structure 4032A are disposed in a first groove in an upper surface of the substrate layer 401; and a second gate structure 4032B and a second bottom gate insulation layer 4022B covering the second gate structure 4032B are disposed in a second groove in the upper surface of the substrate layer 401;
a first channel layer 4061 that covers the first bottom gate insulation layer 4022A and that has a groove shape;
a second channel layer 4062 that covers the second bottom gate insulation layer 4022B and that has a groove shape, where
a first top gate insulation layer 4021C and a third gate structure 4031C covering the first top gate insulation layer 4021C are disposed on a bottom surface of a groove formed by the first channel layer 4061;
a second top gate insulation layer 4021D and a fourth gate structure 4031D covering the second top gate insulation layer 4021D are disposed on a bottom surface of a groove formed by the second channel layer 4062;
a drain 405 disposed in a groove structure formed by the substrate layer 401, a first outer surface of the first channel layer 4061 and a first outer surface of the second channel layer 4062;

a first source structure 4041 that covers the substrate layer 401 and that is in contact with a second outer surface of the first channel layer 4061; and a second source structure 4042 that covers the substrate layer 401 and that is in contact with a second outer surface of the second channel layer 4062.

In a possible design of the second aspect, the channel layer uses one of graphene, molybdenum disulfide, black phosphorus, or another two-dimensional material.

According to a third aspect, a field effect transistor manufacturing method is provided, and the method includes:

providing a substrate layer;

forming a bottom gate electrode on the substrate layer, where the bottom, gate electrode includes a first gate structure and a second gate structure;

forming a bottom gate insulation layer on the bottom gate electrode;

attaching a channel layer onto the bottom gate insulation layer;

forming a source electrode and a drain on the grapheme layer, where the source electrode includes a first source structure and a second source structure;

forming a top gate insulation layer on the graphene layer, the source electrode, and the drain; and forming a top gate electrode on the top gate insulation layer, where the top gate electrode includes a third gate structure and a fourth gate structure.

In a possible design of the third aspect, the forming a bottom gate electrode on the substrate layer includes:

forming two groove structures on the substrate layer by using a photolithography technique and an etching technique; and forming the first gate structure of the bottom gate electrode and the second gate structure of the bottom gate electrode in the two groove structures, respectively.

In a possible design of the third aspect, before the forming a bottom gate insulation layer, the method further includes:

processing, by using a chemical mechanical polishing method, a surface of the substrate layer on which the bottom gate electrode is formed.

In a possible design of the third aspect, the forming a top gate electrode on the top gate insulation layer includes:

making a vertical contact hole between the top gate electrode and the bottom gate electrode, so that the top gate electrode and the bottom gate electrode connect with each other.

According to a fourth aspect, a field effect transistor manufacturing method is provided, and the method includes:

providing a substrate layer;

preparing, on the substrate layer, a thin film structure need for forming a source electrode and a drain;

forming a sacrificial layer on the thin film structure, where the sacrificial layer may be dissolved in a specific solution;

forming a first groove structure and a second groove structure on the substrate layer, the thin film structure, and the sacrificial layer;

forming a first gate structure of a bottom gate electrode and a second gate structure of the bottom gate electrode in the first groove structure and the second groove structure, respectively;

forming a first bottom gate insulation layer and a second bottom gate insulation layer in the first groove structure and the second groove structure, respectively;

attaching a channel layer;

forming a first top gate insulation layer and a second top gate insulation layer on the channel layer;

forming a third gate structure of a top gate electrode and a fourth gate structure of the top gate electrode on the first top gate insulation layer and the second top gate insulation layer, respectively; and corroding the sacrificial layer.

In a possible design of the fourth aspect, after the first bottom gate insulation layer and the second bottom gate insulation layer are formed, the attaching a channel layer includes:

depositing the channel layer in situ, so that the channel layer folds and clings snugly against the first groove structure and the second groove structure that are on the first bottom gate insulation layer and the second bottom gate insulation layer.

In a possible design of the fourth aspect, the forming a third gate structure of a top gate electrode and a fourth gate structure of the top gate electrode includes:

making a vertical contact hole between the top gate electrode and the bottom gate electrode, so that the top gate electrode and the bottom gate electrode connect with each other.

Beneficial effects of the technical solutions provided by the embodiments of the present application are as follows:

The field effect transistor provided in the present application includes two top gate structures and two bottom, gate structures, and the top gate structures and the bottom gate structures are opposite to each other in pair. This increases a quantity of control-voltage-induced carriers in the field effect transistor, and therefore increases an output current of the field effect transistor, improves a power gain limit frequency in high-frequency use, and makes an electric field between the top gate structures and the bottom gate structures more adequately cover the channel layer between the source electrode and the drain, thereby reducing a parasitic effect in a high frequency, and further improving a frequency characteristic of the field effect transistor.

BRIEF DESCRIPTION OF DRAWINGS

To describe the technical solutions in the embodiments of the present application more clearly, the following briefly describes the accompanying drawings need for describing the embodiments. Apparently, the accompanying drawings in the following description show merely some embodiments of the present application, and a person of ordinary skill in the art may still derive other drawings from these accompanying drawings without creative efforts.

DESCRIPTION OF EMBODIMENTS

To make the objectives, technical solutions, and advantages of the present application clearer, the following further describes the implementations of the present application in detail with reference to the accompanying drawings.

Embodiment 1

Figure 1:
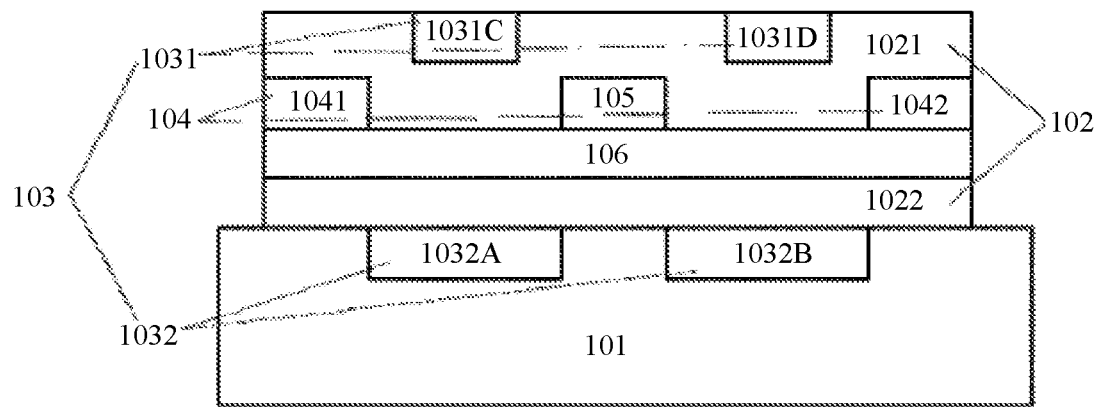
FIG. 1 is a schematic structural diagram of a vertical section of a field effect transistor according to Embodiment 1 of the present application.

FIG. 1 is a schematic structural diagram of a vertical section of a field effect transistor according to Embodiment 1 of the present application. As shown in the Figure, the field effect transistor includes:

a substrate layer 101, where a first gate structure 1032A and a second gate structure 1032B are disposed in a groove in an upper surface of the substrate layer 101;

a bottom gate insulation layer 1022 covering the upper surface of the substrate layer 101, where the bottom gate insulation layer 1022 is used to make the first gate structure 1032A and the second gate structure 1032B that act as a bottom gate electrode in a disconnected state with a channel layer 106;

the channel layer 106 covering an upper surface of the bottom gate insulation layer 1022; and a top gate insulation layer 1021 covering an upper surface of the channel layer 106, where a first source structure 1041, a second source structure 1042, and a drain 105 disposed between the first source structure 1041 and the second source structure 1042, are disposed on a lower surface of the top gate insulation layer 1021, and with this structure, the channel layer 106 is in contact with the first source structure 1041, the second source structure 1042, and the drain 105, so that when a control voltage is applied by using a gate electrode 103, a conductive channel is formed between the source electrode 104 and the drain 105 based on the channel layer 106; a third gate structure 1031C and a fourth gate structure 1031D are disposed in a groove in an upper surface of the top gate insulation layer 1021, and the top gate insulation layer 1021 is used to make the third gate structure 1031C and the fourth gate structure 1031D in a disconnected state with the channel layer 106;

the third gate structure 1031C is disposed in a first projection region, of the first gate structure 1032A, on the top gate insulation layer 1021, and the first projection region is located between the first source structure 1041 and the drain 105; and the fourth gate structure 1031D is disposed in a second projection region, of the second gate structure 1032B, on the top gate insulation layer 1021, and the second projection region is located between the second source structure 1042 and the drain 105.

To apply a control voltage to both the top and the bottom of the channel layer 106, so as to increase a quantity of carriers induced by the control voltage, and therefore increase an output current of the field effect transistor, and improve a power gain limit frequency during high-frequency use, the structure provided in this embodiment of the present application includes the third gate structure 1031C and the fourth gate structure 1031D that act as a top gate electrode, and the first gate structure 1032A and the second gate structure 1032B that act as the bottom gate electrode.

The drain 105 is disposed between the first source structure 1041 and the second source structure 1042, so that conductive channels are formed between the first source structure 1041 and the drain 105, and between the second source structure 1042 and the drain 105, respectively, thereby providing a bi-conductive-channel structure, and further increasing the output current of the field effect transistor, and improving the power gain limit frequency during high-frequency use.

The first gate structure 1032A is corresponding to the third gate structure 1031C, to apply a control voltage to one conductive channel; and the second gate structure 1032B is corresponding to the fourth gate structure 1031D, to apply the control voltage to the other conductive channel. It should be noted that, in actual application, a gate electrode, a gate electrode insulation layer, and a source electrode that are used to form one conductive channel may have same shapes and sizes as a gate electrode, a gate electrode insulation layer, and a source electrode that are used to form the other conductive channel, respectively, or the shapes and sizes may differ depending on a need. A specific shape and size of any one of the foregoing structures is not limited in the present application. It should also be noted that, in actual application, a voltage connected from the first source structure 1041 and the second source structure 1042 that act as the source electrode to the drain 105 may be applied in an opposite direction, and therefore the first source structure 1041 and the second source structure 1042 may be set to a drain, and the drain 105 may be set to a source electrode. Whether the source electrode and the drain are interchanged is not limited in the present application.

Figure 2:
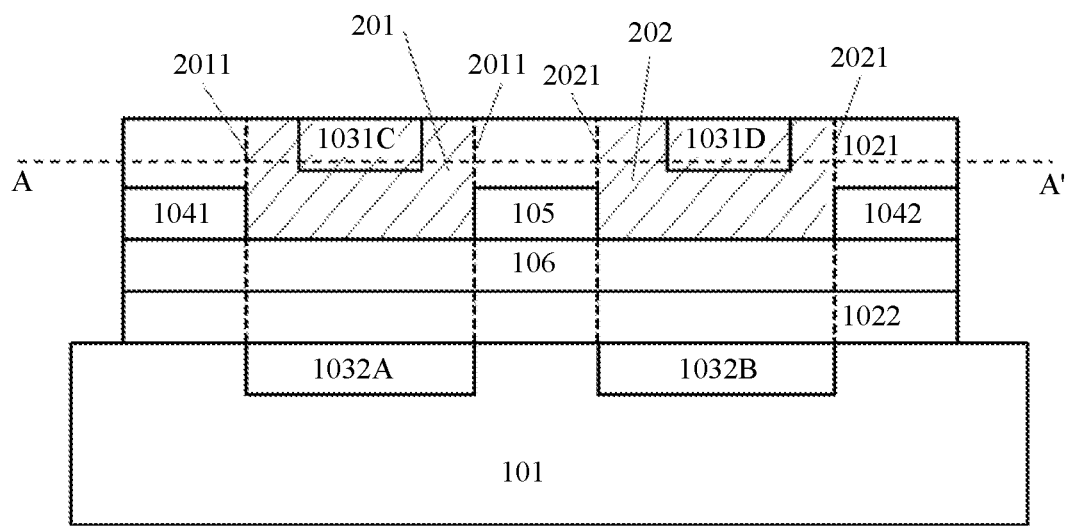
FIG. 2 is a schematic diagram of a projection region in a vertical section structure of a field effect transistor according to Embodiment 1 of the present application.

When the control voltage is applied, to make an electric field between the top gate electrode 1031 and the bottom gate electrode 1032 adequately cover the channel layer 106 between the first source structure 1041 and the second source structure 1042, and the drain 105, and therefore reduce a parasitic effect, for example, parasitic resistance or parasitic capacitance, of the field effect transistor at a high frequency, and improve a frequency characteristic of the field effect transistor, in this embodiment of the present application, as shown in FIG. 2, the third gate structure 1031C is disposed in a first projection region 201, of the first gate structure 1032A, on the top gate insulation layer 1021, the first projection region 201 is located between the first source structure 1041 and the drain 105, and the top gate insulation layer 1021, the channel layer 106, and the bottom, gate insulation layer 1022 are disposed in turn between the third gate structure 1031C and the first gate structure 1032A. The top gate insulation layer 1021 and the bottom, gate insulation layer 1022 are collectively referred to as gate electrode insulation layers 102, and the top gate electrode 1031 and the bottom gate electrode 1032 are collectively referred to as gate electrodes 103.

Correspondingly, the fourth gate structure 1031D is disposed in the second projection region 202, of the second gate structure 1032B, on the top gate insulation layer 1021, the second projection region 202 is located between the second source structure 1042 and the drain 105, and the top gate insulation layer 1021, the channel layer 106, and the bottom gate insulation layer 1022 are disposed in turn between the fourth gate structure 1031D and the second gate structure 1032B.

When the control voltage is applied, to make the electric field between the top gate electrode and the bottom gate electrode more adequately cover the channel layer 106 between the first source structure 1041 and the second source structure 1042, and the drain 105, and therefore reduce the parasitic effect at a high frequency, in this embodiment of the present application, as shown in FIG. 2, two edges 2011 of the first projection region 201 coincide with an edge of the first source structure 1041 and an edge of the drain 105, respectively, and two edges 2021 of the second projection region 202 coincide with an edge of the second source structure 1042 and an edge of the drain 105, respectively.

Figure 3:
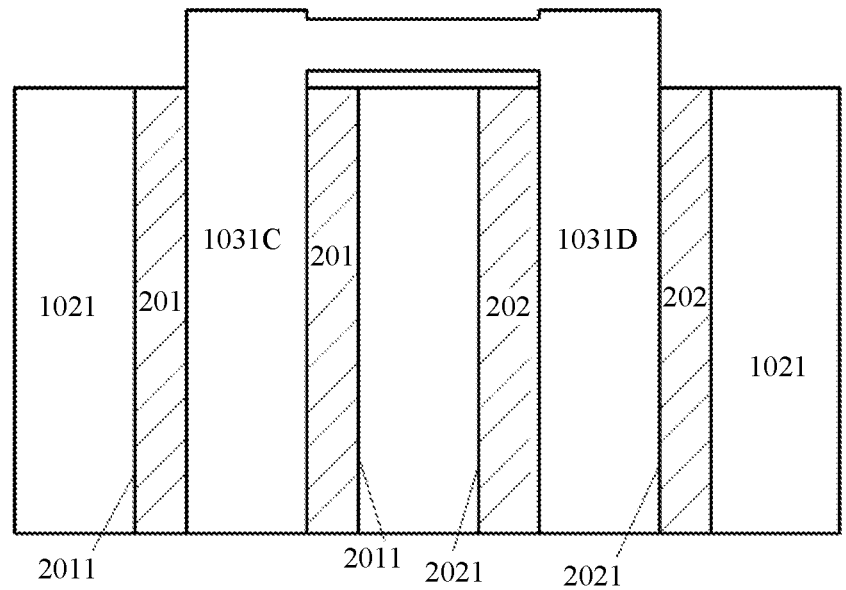
FIG. 3 is a cutaway drawing of a field effect transistor according to Embodiment 1 of the present application, along an AA' direction in FIG. 2.

When the control voltage is applied, to make the electric field between the top gate electrode 1031 and the bottom gate electrode 1032 more adequately cover the channel layer 106 between the source electrode 104 and the drain 105, and therefore reduce the parasitic effect at a high frequency, in this embodiment of the present application, an area of the third gate structure 1031C is less than or equal to an area of the first projection region 201, and an area of the fourth gate structure 1031D is less than or equal to an area of the second projection region 202. FIG. 3 is a cutaway drawing of FIG. 2 along an AA' direction. As shown in FIG. 3, the area of the first projection area 201 or the area of the second projection area 202 is an area, occupied by the either projection area, on a plane parallel to the substrate layer 101.

To further increase the output current of the field effect transistor, and further improve the power gain limit frequency during high-frequency use, in this embodiment of the present application, the third gate structure 1031C and the fourth gate structure 1031D are parallel to each other. Specifically, as shown in FIG. 3, the third gate structure 1031C and the fourth gate structure 1031D form a doorframe-like communicating structure. To be specific, the top gate electrode includes two parts that are parallel to each other and a communicating part used to connect the two parts. The parts parallel to each other may both be rectangular structures. It should be rioted that any one of the gate structures may be disposed depending on an actual application scenario, and is not limited in the present application.

For ease of manufacturing, the substrate layer 101 has a groove structure, and the bottom gate electrode 1032 is disposed in the groove structure. Specifically, the substrate layer 101 has two groove structures parallel to each other, and the first gate structure 1032A and the second gate structure 1032B of the bottom gate electrode 1032 are disposed in the two groove structures parallel to each other, respectively.

To apply a same control voltage to the top gate electrode 1031 and the bottom gate electrode 1032, the top gate electrode and the bottom gate electrode connect with each with through a contact hole. In other words, the first gate structure 1032A and the third gate structure 1031C connect with each other through the contact hole, and the second gate structure 1032B and the fourth gate structure 1031D connect with each other through the contact hole. A specific location of the contact hole may be selected depending on an actual scenario of circuit wiring, and is not limited in the present application.

Embodiment 2

Figure 4:
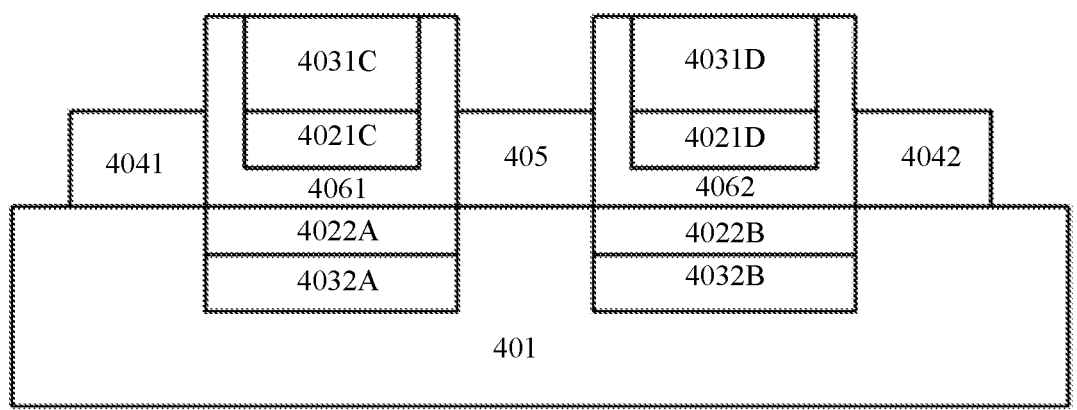
FIG. 4 is a schematic structural diagram of a vertical section of a field effect transistor according to Embodiment 2 of the present application.

FIG. 4 is a schematic structural diagram of a vertical section of a field effect transistor according to Embodiment 2 of the present application. As shown in the figure, the field effect transistor includes:

a substrate layer 401, where a first gate structure 4032A and a first bottom gate insulation layer 4022A covering the first gate structure 4032A are disposed in a first groove in an upper surface of the substrate layer 401, and a second gate structure 4032B and a second bottom gate insulation layer 4022B covering the second gate structure 4032B are disposed in a second groove in the upper surface of the substrate layer 401, to facilitate manufacturing;

a first channel layer 4061 that covers the first bottom gate insulation layer 4022A and that has a groove shape;

a second channel layer 4062 that covers the second bottom gate insulation layer 4022B and that has a groove shape, where a first top gate insulation layer 4021C and a third gate structure 4031C covering the first top gate insulation layer 4021C are disposed on a bottom surface of a groove formed by the first channel layer 4061; and a second top gate insulation layer 4021D and a fourth gate structure 4031D covering the second top gate insulation layer 4021D are disposed on a bottom surface of a groove formed by the second channel layer 4062, where this structure is used to facilitate manufacturing based on soft mechanical performance of graphene;

a drain 405 disposed in a groove structure formed by the substrate layer 401, a first outer surface of the first channel layer 4061 and a first outer surface of the second channel layer 4062;

a first source structure 4041 that covers the substrate layer 401 and that is in contact with a second outer surface of the first channel layer 4061; and a second source structure 4042 that covers the substrate layer 401 and that is in contact with a second outer surface of the second channel layer 4062.

The first channel layer 4061 is in contact with the first source structure 4041 and the drain 405, to form a conductive channel between the first source structure 4041 and the drain 405; and the second channel layer 4062 is in contact with a second source structure 4042 and the drain 405, to form a conductive channel between the second source structure 4042 and the drain 405. In this way, when a control voltage is applied, an electric field between a top gate electrode and a bottom gate electrode can cover channel layers between the source electrode and the drain completely, and therefore further reduce a parasitic effect at a high frequency.

It should be noted that, in actual application, the first top gate insulation layer 4021C and the second top gate insulation layer 4021D may connect or not connect with each other, the first bottom gate insulation layer 4022A and the second bottom gate insulation layer 4022B may connect or not connect with each other. This is not limited in the present application.

Embodiment 3

Figure 5:
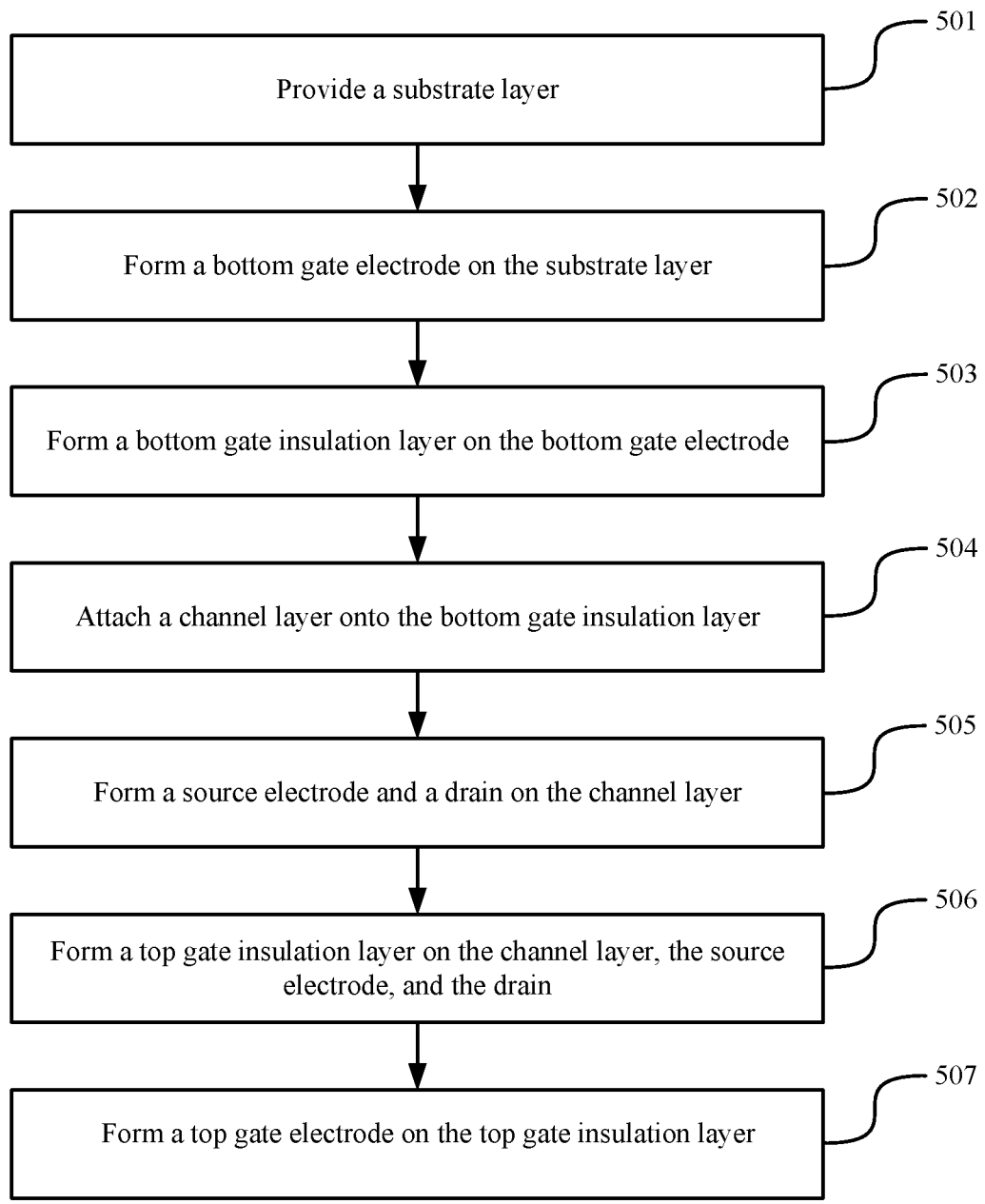
FIG. 5 is a flowchart of a field effect transistor manufacturing method according to Embodiment 3 of the present application.

FIG. 5 is a flowchart of a field effect transistor manufacturing method according to Embodiment 3 of the present application. The method is used to manufacture the field effect transistor provided in Embodiment 1, and is described by using an example in which graphene is used as a channel material. The method includes the following steps.

Figure 6:
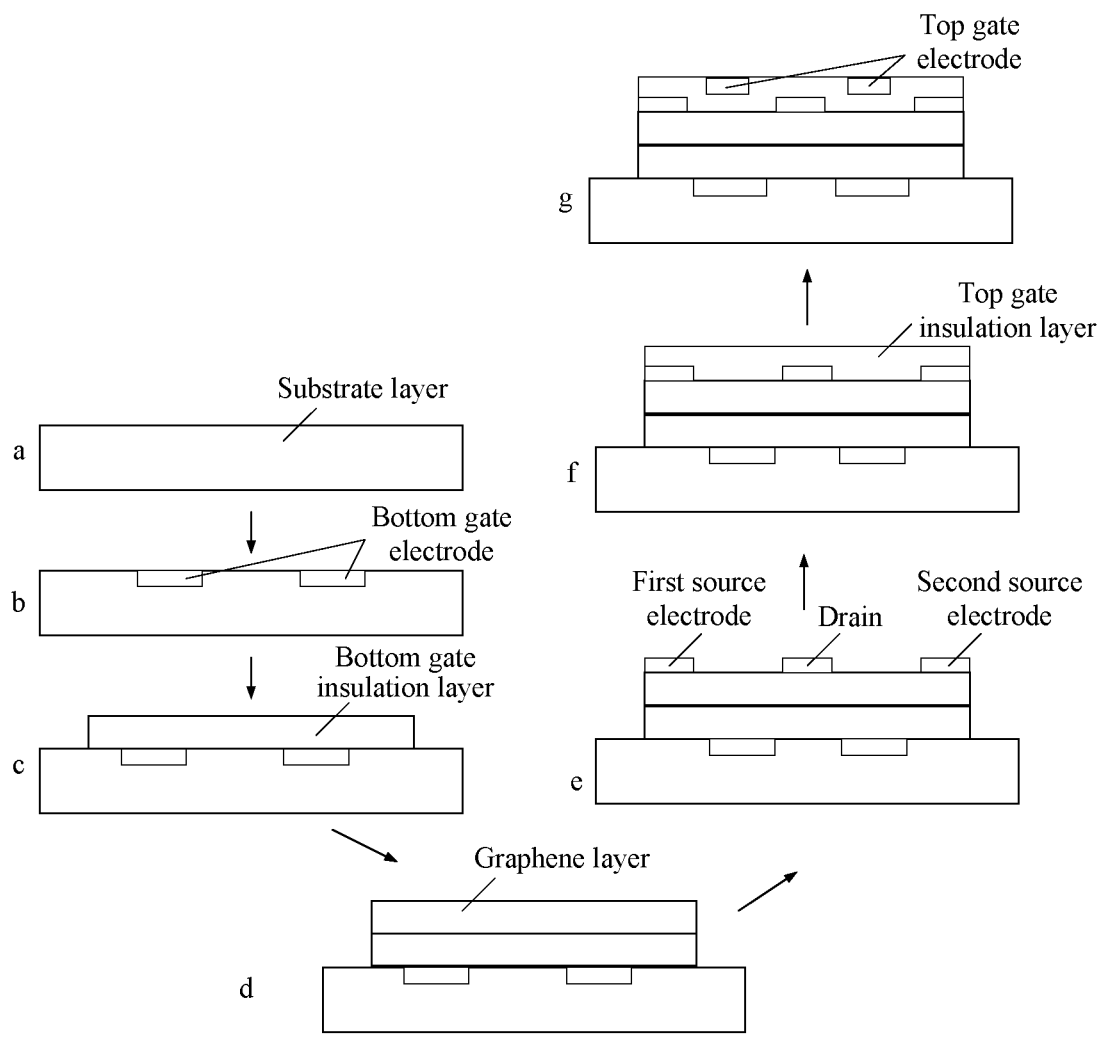
FIG. 6 is a schematic structural diagram of a to-be-manufactured field effect transistor when each step in a field effect transistor manufacturing method according to Embodiment 3 of the present application is implemented.

501. Provide a substrate layer, as shown in diagram a in FIG. 6. In actual application, a material of the substrate layer may be an insulation material such as silicon dioxide (SiO2), silicon carbide (SiC), boron nitride (BN), silicon nitride (Si3N4), polyethylene terephthalate (PET), or a sapphire. The substrate layer material is not specifically limited in the present application.

502. Form a bottom gate electrode on the substrate layer, as shown in diagram b in FIG. 6, where the bottom gate electrode includes a first gate structure and a second gate structure. Specifically, two groove structures are formed on the substrate layer by using a photolithography technique, an etching technique, and a coating technique, and the first gate structure of the bottom gate electrode and the second gate structure of the bottom gate electrode are formed in the two groove structures, respectively. In actual application, a material of the bottom gate electrode may be a metal material such as copper, platinum, or gold. The bottom gate electrode material is not limited in the present application. In actual application, depending on a size characteristic of a to-be-manufactured field effect transistor, the selected photolithography technique may be a regular photolithography technique or an electron beam exposure photolithography technique. This is not limited in the present application. In actual application, the etching technique includes plasma etching or the like, and the coating technique includes a sputtering coating technique, an evaporation coating technique, or the like. A specific technique for forming the bottom gate electrode is not limited in the present application.

503. Form a bottom gate insulation layer on the bottom gate electrode, as shown in diagram c in FIG. 6. In this embodiment of the present application, before this step, a surface of the substrate layer on which the bottom gate electrode is formed is processed by using a chemical mechanic polishing method, to make the surface flat. A material of the bottom gate insulation layer may be $SiO_2$, $Al_2O_3$, or the like. This is not limited in the present application. A specific technique for forming the bottom gate insulation layer may be chemical vapor deposition, atom layer deposition, or the like. This is not limited in the present application.

504. Attach a graphene layer onto the bottom gate insulation layer, as shown in diagram d in FIG. 6.

505. Form a source electrode and a drain on the graphene layer, as shown in diagram e in FIG. 6, where the source electrode includes a first source structure and a second source structure, and the drain is disposed between the first source structure and the second source structure. A specific forming process includes: defining a source electrode region and a drain region on the graphene layer by using a photolithography technique, and then forming the source electrode and the drain by using the coating technique. A material of the source electrode and the drain may be a metal such as copper, platinum, or gold.

506. Form a top gate insulation layer on the graphene layer, the source electrode, and the drain, as shown in diagram f in FIG. 6. A material of the top gate insulation layer may be silicon dioxide ($SiO_2$), aluminum oxide ($Al_2O_3$), or the like. This is not limited in the present application. A specific technique for forming the top gate insulation layer may be chemical vapor deposition, atom layer deposition, or the like. This is not limited in the present application.

507. Form a top gate electrode on the top gate insulation layer, as shown in diagram g in FIG. 6, where the top gate electrode includes a third gate structure and a fourth gate structure. Specifically, the forming a top gate electrode on the top gate insulation layer includes making a vertical contact hole between the top gate electrode and the bottom gate electrode, so that the top gate electrode and the bottom gate electrode connect with each other.

Embodiment 4

Figure 7:
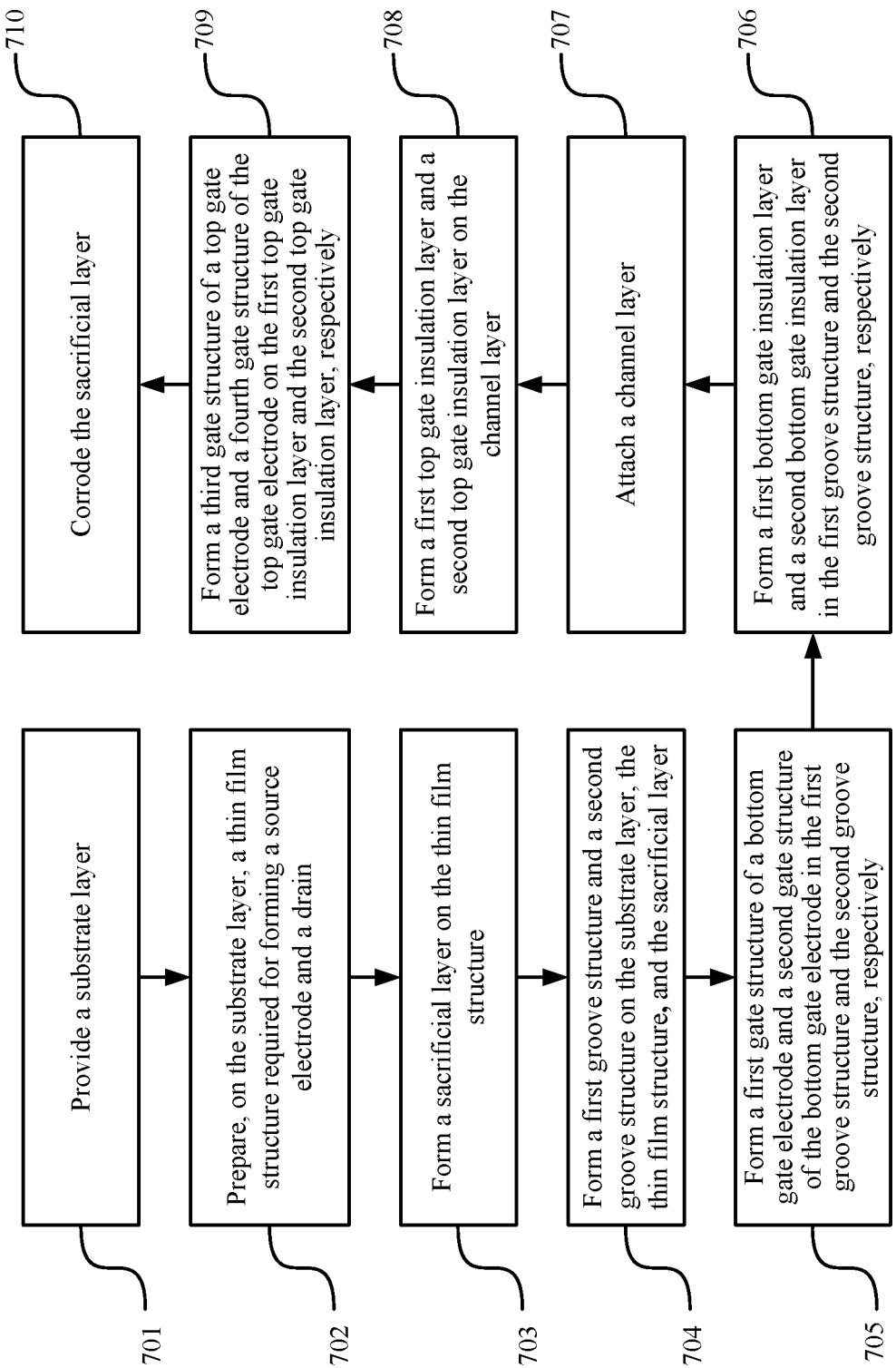
FIG. 7 is a flowchart of a field effect transistor manufacturing method according to Embodiment 4 of the present application.

FIG. 7 is a flowchart of a field effect transistor manufacturing method according to Embodiment 4 of the present application. The method is used to manufacture the field effect transistor provided in Embodiment 2, and is described by using an example in which graphene is used as a channel material. The method includes the following steps.

Figure 8:
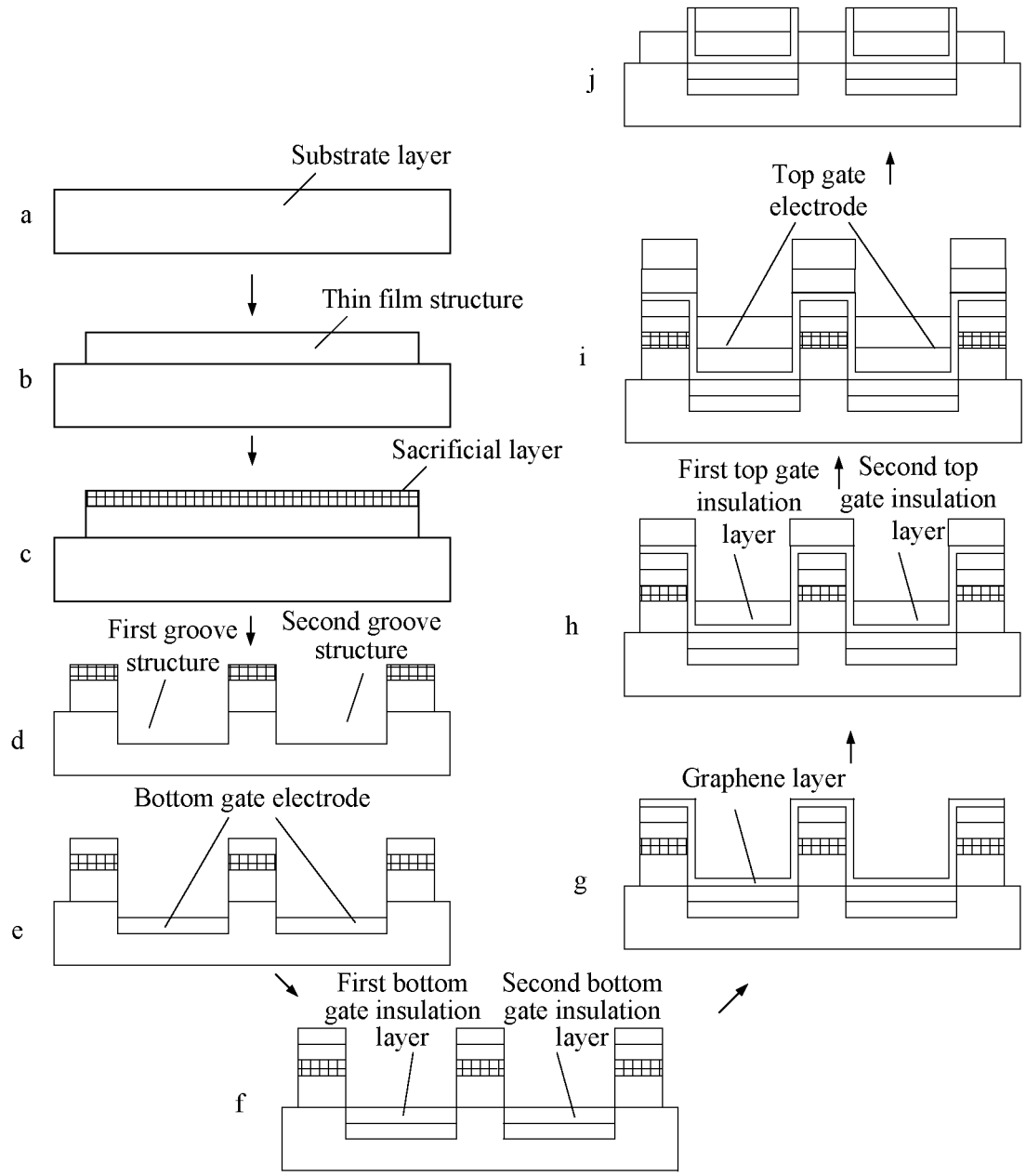
FIG. 8 is a schematic structural diagram. of a to-be-manufactured field effect transistor when each step in a field effect transistor manufacturing method according to Embodiment 4 of the present application is implemented.

701. Provide a substrate layer, as shown in diagram a in FIG. 8. This step is the same as step 501 in Embodiment 3 and is not further described herein.

702. Prepare, on the substrate layer, a thin film structure need for forming a source electrode and a drain, as shown in diagram b in FIG. 8. The thin film structure may be formed by using a coating technique. The coating technique includes a sputtering coating technique, an evaporation coating technique, or the like. A specific technique for forming the thin film structure is not limited in the present application. In actual application, a material of the thin film structure may be a metal material such as copper, platinum, or gold. The thin film structure material is not limited in the present application.

703. Form a sacrificial layer on the thin film structure, as shown in diagram c in FIG. 8, where the sacrificial layer may be dissolved in a specific solution. A material of the sacrificial layer may be silicon oxide, polycrystalline silicon, silicon nitride, photoresist, or the like. This is not specifically limited in the present application.

704. Form a first groove structure and a second groove structure on the substrate layer, the thin film structure, and the sacrificial layer, as shown in diagram d in FIG. 8. The first groove structure and the second groove structure are formed by using a photolithography technique and an etching technique. In actual application, depending on a size characteristic of a to-be-manufactured field effect transistor, the selected photolithography technique may be a regular photolithography technique or an electron beam exposure photolithography technique. This is not limited in the present application. The etching technique includes ion beam etching or the like. A specific technique for forming the first groove structure and the second groove structure is not limited in the present application.

705. Form a first gate structure of a bottom gate electrode and a. second gate structure of the bottom gate electrode in the first groove structure and the second groove structure, respectively, as shown in diagram e in FIG. 8. The first gate structure of the bottom gate electrode and the second gate structure of the bottom gate electrode are formed, by using an electron beam evaporation coating technique. In actual application, the first gate structure and the second gate structure may alternatively be formed by using another technique. This is not limited in the present application.

706. Form a first bottom gate insulation layer and a second bottom gate insulation layer in the first groove structure and the second groove structure, respectively, as shown in diagram f in FIG. 8. The first bottom gate insulation layer and the second bottom gate insulation layer are formed by using the electron beam evaporation coating technique. In actual application, the first bottom gate insulation layer and the second bottom gate insulation layer may alternatively be formed by using another technique. This is not limited in the present application.

707. Attach a graphene layer, as shown in diagram g in FIG. 8. The graphene layer is deposited in situ, so that the graphene layer folds and clings snugly against the first groove structure and the second groove structure that are on the first bottom gate insulation layer and the second bottom gate insulation layer. In this embodiment of the present application, graphene is evenly and continuously attached onto a surface of the structure, to be in ohmic contact with a metal in the structure.

708. Form a first top gate insulation layer and a second top gate insulation layer on the graphene layer, as shown in diagram h in FIG. 8. The first top gate insulation layer and the second top gate insulation layer are formed by using the electron beam evaporation coating technique. In actual application, the first top gate insulation layer and the second top gate insulation layer may alternatively be formed by using another technique. This is not limited in the present application.

709. Form a third gate structure of a top gate electrode and a fourth gate structure of the top gate electrode on the first top gate insulation layer and the second top gate insulation layer, respectively, as shown in diagram i in FIG. 8. A specific forming process includes: making a vertical contact hole between the top gate electrode and the bottom gate electrode, so that the top gate electrode and the bottom gate electrode connect with each other.

710. Corrode the sacrificial layer, as shown in diagram j in FIG. 8. By corroding the sacrificial layer, a structure on the sacrificial layer falls off, and a to-be-manufactured field effect transistor is obtained.

A person of ordinary skill in the art may understand that all or some of the steps of the embodiments may be implemented by hardware or a program instructing related hardware. The program may be stored in a computer-readable storage medium. The storage medium may include: a read-only memory, a magnetic disk, or an optical disc.

The foregoing descriptions are merely examples of embodiments of the present application, but are not intended to limit the present application. Any modification, equivalent replacement, and improvement made without departing from the spirit and principle of the present application shall fall within the protection scope of the present application.

What is claimed is:

1. A field effect transistor, comprising:
a substrate layer having a first gate structure and a second gate structure disposed in a groove in an upper surface of the substrate layer;
a bottom gate insulation layer covering the upper surface of the substrate layer;
a channel layer covering an upper surface of the bottom gate insulation layer;
a top gate insulation layer covering an upper surface of the channel layer;
a first source structure and a second source structure disposed on a lower surface of the top gate insulation layer;
a drain disposed between the first source structure and the second source structure; and
a third gate structure and a fourth gate structure disposed in a groove in an upper surface of the top gate insulation layer, wherein the third gate structure is disposed in a first projection region of the first gate structure on the top gate insulation layer and the first projection region is located between the first source structure and the drain, and wherein the fourth gate structure is disposed in a second projection region of the second gate structure on the top gate insulation layer and the second projection region is located between the second source structure and the drain.

2. The field effect transistor according to claim 1, wherein:
two edges of the first projection region coincide with an edge of the first source structure and an edge of the drain, respectively; and
two edges of the second projection region coincide with an edge of the second source structure and an edge of the drain, respectively.

3. The field effect transistor according to claim 1, wherein:
an area of the third gate structure is less than or equal to an area of the first projection region; and
an area of the fourth gate structure is less than or equal to an area of the second projection region.

4. The field effect transistor according to claim 1, wherein:
the third gate structure and the fourth gate structure are parallel to each other; or
the third gate structure and the fourth gate structure form a door-frame-like communicating structure.

5. The field effect transistor according to claim 1, wherein:
the first gate structure and the third gate structure connect with each other through a contact hole; and
the second gate structure and the fourth gate structure connect with each other through a contact hole.

6. The field effect transistor according to claim 1, wherein the channel layer comprises a two-dimensional material.

7. The field effect transistor according to claim 6, wherein the channel layer comprises at least one of: graphene, molybdenum disulfide or black phosphorus.

8. A field effect transistor, comprising:
a substrate layer comprising,
    a first gate structure and a first bottom gate insulation layer covering the first gate structure and disposed in a first groove in an upper surface of the substrate layer, and
    a second gate structure and a second bottom gate insulation layer covering the second gate structure and disposed in a second groove in the upper surface of the substrate layer;
a first channel layer covering the first bottom gate insulation layer and having a groove shape;
a second channel layer covering the second bottom gate insulation layer and having a groove shape; a first top gate insulation layer and a third gate structure disposed on a bottom surface of a groove formed by the first channel layer, wherein the third gate structure covers the first top gate insulation layer;
a second top gate insulation layer and a fourth gate structure disposed on a bottom surface of a groove formed by the second channel layer, wherein the fourth gate structure covers the second top gate insulation layer;
a source electrode disposed in a groove structure formed by the substrate layer, a first outer surface of the first channel layer, and a first outer surface of the second channel layer;
a first source structure covering the substrate layer and contacting a second outer surface of the first channel layer; and
a second source structure covering the substrate layer and contacting a second outer surface of the second channel layer.

9. The field effect transistor according to claim 8, wherein the channel layer comprises a two-dimensional material.

10. The field effect transistor according to claim 9, wherein the channel layer comprises at least one of: graphene, molybdenum disulfide or black phosphorus.

11. A method for manufacturing a field effect transistor, the method comprising:

providing a substrate layer;
forming a bottom gate electrode on the substrate layer, wherein the bottom gate electrode comprises a first gate structure and a second gate structure;
forming a bottom gate insulation layer on the bottom gate electrode;
attaching a channel layer on the bottom gate insulation layer;
forming a source electrode and a drain on a graphene layer, wherein the source electrode comprises a first source structure and a second source structure;
forming a top gate insulation layer on the graphene layer, the source electrode, and the drain; and
forming a top gate electrode on the top gate insulation layer, wherein the top gate electrode comprises a third gate structure and a fourth gate structure.

12. The method according to claim 11, wherein forming a bottom gate electrode on the substrate layer comprises:
forming two groove structures on the substrate layer by using a photolithography technique and an etching technique; and
forming the first gate structure of the bottom gate electrode and the second gate structure of the bottom gate electrode in the two groove structures, respectively.

13. The method according to claim 11, wherein before forming a bottom gate insulation layer, the method further comprises:
chemical mechanical polishing (CMP) a surface of the substrate layer on which the bottom gate electrode is formed.

14. A method of manufacturing a field effect transistor, the method comprising:
providing a substrate layer;
forming, on the substrate layer, a thin film structure for use in forming a source electrode and a drain;
forming a sacrificial layer on the thin film structure, wherein the sacrificial layer comprises material that is dissolvable in a specific solution;
forming a first groove structure and a second groove structure on the substrate layer, the thin film structure, and the sacrificial layer;
forming a first gate structure of a bottom gate electrode and a second gate structure of the bottom gate electrode in the first groove structure and the second groove structure, respectively;
forming a first bottom gate insulation layer and a second bottom gate insulation layer in the first groove structure and the second groove structure, respectively;
attaching a channel layer;
forming a first top gate insulation layer and a second top gate insulation layer on the channel layer;
forming a third gate structure of a top gate electrode and a fourth gate structure of the top gate electrode on the first top gate insulation layer and the second top gate insulation layer, respectively; and
etching the sacrificial layer.

15. The method according to claim 14, wherein after forming the first bottom gate insulation layer and the second bottom gate insulation layer in the first groove structure and the second groove structure, respectively, attaching a channel layer comprises:
depositing the channel layer in situ, so that the channel layer folds and clings snugly against the first groove structure and the second groove structure.

* * * * *